United States Patent [19]

Konotsune et al.

[11] Patent Number: 5,077,084

[45] Date of Patent: Dec. 31, 1991

[54] PROCESS FOR PRODUCING A FLEXIBLE PRINTED BASE

[75] Inventors: Shiro Konotsune, Kanagawa; Atsushi Takahashi, Ichihara; Shouichi Fukunaga, Ichihara; Kazutsune Kikuta, Ichihara, all of Japan

[73] Assignee: Chisso Corporation, Osaka, Japan

[21] Appl. No.: 473,461

[22] Filed: Feb. 1, 1990

[30] Foreign Application Priority Data

Feb. 17, 1989 [JP] Japan .................................. 1-37829

[51] Int. Cl.$^5$ .............................................. B05D 5/12
[52] U.S. Cl. ...................................... 427/96; 427/377; 427/379; 427/388.1; 29/DIG. 42
[58] Field of Search ............... 427/388.1, 96, 102, 427/377, 379; 148/11.5 C; 29/DIG. 42

[56] References Cited

U.S. PATENT DOCUMENTS

| | | |
|---|---|---|
| 3,894,330 | 7/1975 | Bellis .................................. 228/254 |
| 4,215,157 | 7/1980 | Boldebuck et al. ............... 427/388.1 |
| 4,226,913 | 10/1980 | Henderson ....................... 427/388.1 |
| 4,267,232 | 5/1981 | Schmidt et al. .................. 427/388.1 |
| 4,427,716 | 1/1984 | Siwek ..................................... 427/99 |
| 4,522,880 | 6/1985 | Klostermier et al. ............ 427/388.1 |
| 4,576,857 | 3/1986 | Gannett et al. ....................... 427/96 |
| 4,623,563 | 11/1986 | Noda et al. ........................... 427/96 |
| 4,839,232 | 6/1989 | Morita et al. ......................... 427/96 |

Primary Examiner—Michael Lusignan
Assistant Examiner—Diana L. Dudash
Attorney, Agent, or Firm—Fred Philpitt

[57] ABSTRACT

In a process for producing a flexible printed base by directly coating a copper foil with a polyimide precursor, followed by heating, drying and curing, a process affording a flexible printed base having a superior folding endurance and a good heat resistance at a cheap cost is provided, which process comprises carrying out the curing in an inert gas under a tension of 0.02 to 0.2 Kg/cm and at 200° and 450° C.

3 Claims, No Drawings

PROCESS FOR PRODUCING A FLEXIBLE PRINTED BASE

BACKGROUND OF THE INVENTION

1. Field of the Invention

This invention relates to a process for producing a flexible printed base having a good heat resistance and a superior folding endurance.

2. Description of the Related Art

Flexible printed bases are used for producing printed circuits having flexibility, and in recent years, it has been more and more required to make the size of electronic equipment smaller, make the base thinner and make the density of the circuits higher.

Conventional polyimide flexible bases have been mainly produced by applying a polyimide film onto a copper foil by the medium of an adhesive. However, since such bases use an adhesive, problems have been raised in the aspect of heat resistance, electric characteristics, etc.; hence such bases have been impossible to sufficiently make use of the characteristics thereof.

In order to solve these problems, a process of subjecting a polyimide film to hot-melt adhesion onto a copper foil has been disclosed in Japanese patent application laid-open No. Sho 57-181,857/1982 and a process of directly coating a copper foil with a polyimide precursor, followed by heating and drying treatment (hereinafter referred to as "direct coating process") is disclosed in Japanese patent publication Nos. Sho 61-111,359/1986 application laid-open and Sho 63-69,634/1988.

As to these improvement processes, since no adhesive is used, the heat resistance, electric characteristics, etc. are improved, but since the former process employs steps of production of film, its hot-melt adhesion, etc., it requires the same number of steps or more as that of conventional products (using adhesives). Whereas, according to the direct coating process, since it has no step of film production, simplicity of steps is possible and also the heat resistance and electric characteristics of the resulting flexible printed base are superior, but the process cannot contribute to the high folding endurance of the base. Further, for use applications requiring a high folding endurance, rolled copper foil rather than electrolytic copper foil has often been used as copper foil. However, in general, rolled copper foil is not only more expensive than electrolytic copper foil, but also the peel strength of the resulting flexible printed base lowers.

The present invention proposes a process for producing a cheap flexible printed base having solved the above problem and having a superior folding endurance.

It has been disclosed that when a flexible printed base is heat-treated at 100° to 200° C., its folding endurance is generally improved by about 1.5 times (Japanese patent application laid-open Nos. Sho 54-110,466/1979 and Sho 53-17,764/1978), but when an electrolytic copper foil is used for the base, the folding endurance does not reach that of rolled copper foil and is insufficient.

Further, when the electrolytic copper foil was subjected to heat curing in the atmosphere at 200° to 450° C, the folding endurance lowered. Whereas, when the above heat curing was carried out in an inert gas having an oxygen concentration of 0.5% or lower, preferably 0.2% or lower and under a tension of 0.02 to 0.2 Kg/cm, it has been found surprisingly enough that the folding endurance of the resulting flexible printed base was improved up to a similar folding endurance to that of rolled copper foil.

This improvement in the folding endurance has been found from X-ray diffraction pattern of the copper foil to originate from inhibition of thermal cleavage reaction of high molecules in the above-mentioned atmosphere and at the same time the crystalline configuration of the copper foil.

The present inventors have made extensive research on the improvement in the folding endurance of the printed base obtained according to the above direct coating process, and as a result have found that the folding endurance is improved by optimizing the conditions of the atmosphere and tension at the time of curing and this fact is greatly related to the crystalline size of copper of copper foil and the selective orientability of the crystalline surface of copper of copper foil.

SUMMARY OF THE INVENTION

The present invention resides in a process for producing a flexible printed base by directly coating a copper foil with a polyimide precursor, followed by heating, drying, and curing which process comprises carrying out said curing in an inert gas under a tension of 0.02 to 0.2 Kg/cm and at 200° to 450° C.

DETAILED DESCRIPTION OF PREFERRED EMBODIMENTS

The inert gas atmosphere referred to herein means an atmosphere formed by purging the inside of a drying furnace with an inert gas such as nitrogen gas, etc. under pressure. As the inert gas, nitrogen gas having an oxygen concentration of 0.5% or less, preferably 0.2% or less is preferred. Of course, it is also possible to use rare gases such as argon, etc. and an inert gas such as $CO_2$ gas.

The flexible printed base in the present invention may be prepared by directly applying a polyimide precursor having a thermal expansion coefficient to the same extent as that of copper onto a copper foil, followed by heating, drying and curing.

As the polyimide precursor applied onto a copper foil, a polymer having repetition units expressed by the following formula is exemplified:

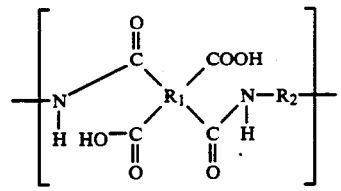

wherein $R_1$ represents a tetravalent aromatic group and $R_2$ represents a divalent aromatic hydrocarbon radical.

Examples of the aromatic tetracarboxylic acid dianhydride ($R_1$) used in the preparation of the above precursor are pyromellitic acid, 2,3,3',4'-tetracarboxydiphenyl, 3,3',4,4'-tetracarboxydiphenyl, 3,3',4,4'-tetracarboxybenzophenone, etc.

Further, concrete examples of aromatic diamine ($R_2$) are p,m-phenylenediamine, 4,4'-diaminodiphenyl ether, 3,4'-diaminodiphenyl ether, 3,3'-diaminodiphenyl ether, 4,4'-diaminodiphenyl ketone, 3,4'-diaminodiphenyl ketone, 4,4'-diaminodiphenyl sulfone, 4,4'-diaminobiphenyl, 3,4'-diaminobiphenyl, 4,4,-diaminodiphenylmethane, 2,2'-bis(4-aminophenyl)propane, 1,4-di(4-aminophenyl)-phenyl ether, 1,3'-di(4-aminophenyl)phenyl ether, diaminosiloxanediamines expressed by the formula

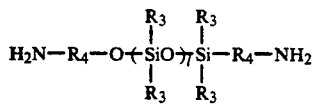

wherein $R_3$ represents an aliphatic hydrocarbon radical of 1 to 3 carbon atoms or an aromatic hydrocarbon radical of 6 to 9 carbon atoms, $R_4$ represents a divalent aliphatic hydrocarbon radical of 3 to 5 carbon atoms or a divalent aromatic hydrocarbon radical of 6 to 9 carbon atoms and ( represents an integer of 3 to 150, etc.

Examples of the organic solvent used for preparing these polyimide precursors are polar organic solvents 0 such as N-methyl-2-pyrrolidone, N,N'-dimethylacetamide, N,N-dimethylformamide, dimethylsulfoxide, cresol, etc. and these may be used alone or in admixture. The reaction is carried out in the range of 0° to 80° C.

As to the process for forming a polyimide film on a copper foil in the present invention, firstly a solution containing 10 to 30% by weight of a polyimide precursor is coated on the surface of the copper foil by means of Comma-Coater, doctor knife or the like, followed by removing the solvent contained in the solution by heating to 100° to 200° C., and heat-curing the resulting material in an inert gas having an oxygen concentration of 0.5% or less, under a tension of 0.02 to 0.2 Kg/cm and at 200° to 450° C.

In the process of the present invention, it is important to optimize the atmosphere and tension at the step of heat-curing at 200° to 450° C.

Namely, according to X-ray diffraction, crystals of copper of copper foil heat-cured at 200° to 450° C in the atmosphere contain copper oxide having a different crystal lattice from that of copper and being heterogeneously coexistent with copper crystals, to reduce the folding endurance of the base.

Further, as the first element of the present invention, when heat-curing is carried out in an inert gas having an oxygen concentration of 0.5% or less, preferably 0.2% or less at a temperature of 200° to 450° C., the resulting copper foil exhibits the same lattice constant as that of untreated copper foil and the crystal size increases uniformly to about three times the original size. Under a tension exceeding 0.2 Kg/cm, the resulting copper foil is elongated to raise a problem of causing anisotropies in MD (machine direction) and TD (transverse direction).

The present invention will be described in more detail by way of Examples and Comparative examples, but it should not be construed to be limited thereto.

PREPARATION EXAMPLE

Into a 10 l capacity glass reactor fixed with a thermometer, a stirrer and a nitrogen gas-introducing tube were introduced p-phenylenediamine (240.8 g), 4,4'-diaminodiphenyl ether (111.4 g) and N-methyl-2-pyrrolidone (7 l) in nitrogen gas current, followed by stirring these and dissolving together, gradually adding to the resulting solution, 3,3',4,4'-biphenyltetracarboxylic acid dianhydride (818.9 g) with stirring, and reacting these at 20° C or lower for 5 hours to obtain a polyamic acid solution of a polyimide precursor.

The resulting polyimide precursor had a logarithmic viscosity of 1.8 as measured in N'-methyl-2-pyrrolidone at a concentration of the precursor of 0.5 g/dl at 30° C.

EXAMPLE 1

The polyimide precursor solution prepared above was coated onto one roughened surface of the two surfaces of an electrolytic copper foil of 18μ thick so as to give a coated thickness of 400 μm by means of a coater, followed by drying the copper foil having the polyimide precursor coated thereon in a hot-air drying furnace at 100° C. and 200° C., each for 10 minutes to remove the solvent contained in the solution and curing the resulting material in nitrogen gas containing an oxygen concentration of 0.3%, under a tension of 0.1 Kg/cm and at 250° C. and 350° C., each for 10 minutes to obtain a flexible printed base of the polyimide of 25μ.

This flexible printed base exhibited a folding endurance (MIT) of TD 57,000 times and MD 56,000 times. The measurement of MIT was carried out by forming a conductor of one reciprocation at a width of 1.5 mm and an interval between circuits of 1.0 mm by etching, flexing the conductor at a curvature radius of 0.8 mm, a flex rate of 180 times/min. and a strength of 500 gf/cm$^2$ and seeking the flex times at which complete disconnection of the conductor circuit occurred (JIS-C-P8115).

EXAMPLE 2

Example 1 was repeated except that an electrolytic copper foil of 35μ thick was used as copper foil to obtain a flexible printed base. The base exhibited a folding endurance of TD 800 times and MD 790 times. When the results are compared with those of Comparative example 5 (using a commercially available product), the folding endurance is superior.

COMPARATIVE EXAMPLE 1

Example 1 was repeated except that heat curing was carried out in the atmosphere, to obtain a flexible printed base. This base was considerably oxidized and exhibited a folding endurance of TD 2,800 times and MD 3,300 times.

COMPARATIVE EXAMPLE 2

Example 1 was repeated except that a copper foil of rolled copper of 18μ was used, to obtain a flexible printed base. This base exhibited a folding endurance of TD 42,000 times and MD 60,000 times.

COMPARATIVE EXAMPLE 3

Example 1 was repeated except that heat curing was carried out under no tension, to obtain a flexible printed base. This base exhibited a folding endurance of TD 35,000 times and MD 32,000 times.

COMPARATIVE EXAMPLE 4

Example 1 was repeated except that heat curing was carried out under a tension of 0.5 Kg/cm, to obtain a flexible printed base. This base exhibited TD 51,000 times and MD 35,000 times. Further, longitudinal wrinkles were formed on the base so that the printed base raised a problem in the aspect of processing step and could not be used.

COMPARATIVE EXAMPLE 5

A commercially available flexible printed base (electrolytic copper product) obtained by conventional lamination with an adhesive was subjected to measurement of its folding endurance in the same manner as in Example 1, to exhibit TD 288 times and MD 330 times.

As described in detail, according to the process of the present invention, when a flexible printed base is produced according to a direct coating process of directly coating a polyimide precursor onto a copper foil, followed by heat curing at a high temperature, it has become possible to produce a flexible printed base having a far superior folding endurance.

What we claim is:

1. A process for producing a flexible printed base which comprises the steps of
   (a) directly coating a copper foil with a polyimide precursor, and
   (b) subjecting said coated copper foil to heating, drying and curing, the curing being carried out in an inert gas under a tension of 0.02 to 0.2 Kg/cm and at a temperature of 200° C. to 450° C.

2. A process for producing a flexible printed base according to claim 1 wherein said inert gas is nitrogen gas having an oxygen concentration of 0.5% by volume or less based upon the nitrogen gas.

3. A process for producing a flexible printed base according to claim 1 wherein an electrolytic copper foil is used as said copper foil.

* * * * *